United States Patent
Iijima et al.

(10) Patent No.: US 8,546,780 B2
(45) Date of Patent: Oct. 1, 2013

(54) NON-VOLATILE MEMORY DEVICE

(75) Inventors: Jun Iijima, Kanagawa (JP); Yasuyoshi Hyodo, Mie (JP); Akihiro Kajita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 13/022,936

(22) Filed: Feb. 8, 2011

(65) Prior Publication Data
US 2011/0198554 A1    Aug. 18, 2011

(30) Foreign Application Priority Data

Feb. 16, 2010   (JP) ................................. 2010-031790

(51) Int. Cl.
*H01L 45/00*   (2006.01)

(52) U.S. Cl.
USPC ........................................ 257/2; 257/E45.003

(58) Field of Classification Search
USPC .............................................. 257/2, E45.003
See application file for complete search history.

(56) References Cited

U.S. PATENT DOCUMENTS

| | | | |
|---|---|---|---|
| 6,064,118 A | 5/2000 | Sasaki | |
| 7,964,862 B2 * | 6/2011 | Chen et al. | 257/4 |
| 8,063,393 B2 * | 11/2011 | Chen | 257/4 |
| 8,203,134 B2 * | 6/2012 | Liu | 257/4 |
| 8,258,496 B2 * | 9/2012 | Toda et al. | 257/5 |
| 2003/0053332 A1 * | 3/2003 | Kleveland et al. | 365/185.03 |
| 2008/0265238 A1 * | 10/2008 | Chen et al. | 257/3 |
| 2008/0296775 A1 | 12/2008 | Matsunaga et al. | |
| 2009/0003047 A1 | 1/2009 | Toda | |
| 2009/0101883 A1 * | 4/2009 | Lai et al. | 257/3 |
| 2010/0032637 A1 * | 2/2010 | Kinoshita et al. | 257/2 |
| 2010/0202186 A1 * | 8/2010 | Sato et al. | 365/148 |
| 2010/0270527 A1 * | 10/2010 | Sawamura | 257/2 |
| 2011/0068313 A1 * | 3/2011 | Liu | 257/4 |
| 2012/0132879 A1 * | 5/2012 | Kinoshita et al. | 257/1 |

FOREIGN PATENT DOCUMENTS

| | | |
|---|---|---|
| JP | 2007-281208 | 10/2007 |
| JP | 2009-009657 | 1/2009 |

OTHER PUBLICATIONS

Naofumi Nakamura et al., "Cost-effective air-gap interconnects by all-in-one post-removing process", Proc. of International Interconnect Technology Conference, 2008, pp. 193-195.

* cited by examiner

*Primary Examiner* — Victor A Mandala
(74) *Attorney, Agent, or Firm* — White & Case LLP

(57) ABSTRACT

According to one embodiment, a non-volatile memory device includes a first wiring extending in a first direction, a second wiring extending in a second direction, and a variable resistance memory cell which is disposed at an intersection between the first wiring and the second wiring so as to be held between the first wiring and the second wiring and includes a variable resistive element and a rectifying element. In a space between the variable resistance memory cells adjacent to each other, at least a periphery of the variable resistive element is evacuated or filled with a gas.

12 Claims, 13 Drawing Sheets

NON-VOLATILE MEMORY DEVICE

CROSS-REFERENCE TO RELATED APPLICATIONS

This application is based upon and claims the benefit of priority from the prior Japanese Patent Application No. 2010-31790, filed on Feb. 16, 2010; the entire contents of which are incorporated herein by reference.

FIELD

Embodiments described herein relate generally to a non-volatile memory device.

BACKGROUND

Recently, Resistive Random Access Memory (ReRAM) has attracted attention as a non-volatile memory device. The ReRAM stores, in a nonvolatile manner, resistance value information of an electrically rewritable variable resistive element, for example, a high resistance state and a low resistance state of the variable resistive element. In such a ReRAM, for example, variable resistance memory cells in which variable resistive elements as storage elements and rectifying elements such as diodes are connected in series are arranged in array at intersections between a plurality of bit lines extending in parallel to a first direction and a plurality of word lines extending in parallel to a second direction perpendicular to the first direction (for example, see Japanese Patent Laid-Open Publication No. 2007-281208). Examples of the variable resistive elements include metal oxides such as NiO, $HfO_2$, $ZrO_2$, $Mn_3O_4$, and $CO_3O_4$, and compounds having a perovskite-type structure or a spinel structure which can switch the resistance state between a high resistance state and a low resistance state according to control of a voltage value and voltage application time. In the conventional art, a space between the variable resistance memory cells is filled with an insulating layer formed of $SiO_2$.

The variable resistive element has a structure in which a variable resistive layer including the above metal oxides is arranged between two electrodes and performs a forming processing after formation of the variable resistive element to thereby reduce the resistance of the variable resistive layer. At that time, it is considered that a filament path formed of metal is formed between the two electrodes, and the resistance of the variable resistive layer is reduced. Processing of applying current to the variable resistive element in the low resistance state and returning the resistance state to the high resistance state by Joule heating is referred to as a reset processing. Meanwhile, processing of applying voltage to the variable resistive element in the high resistance state and returning the resistance state of the variable resistive element to the low resistance state is referred to as a set processing. The high and low resistance states are created by the reset processing and the set processing, and the resistance value information is stored, whereby the variable resistive element is operated as a memory (for example, see Japanese Patent Laid-Open Publication No. 2009-9657).

DETAILED DESCRIPTION

In ReRAM, when a predetermined voltage is applied to a variable resistive element in the switching of the resistance state between a high resistance state and a low resistance state, the variable resistive element generates heat. Although the heat generated by the variable resistive element is lost through a wiring layer, the heat is dissipated also through an insulating film formed around the variable resistive element. Since the insulating film is generally formed of $SiO_2$, a heat discharge is large. Thus, when the resistance state is changed from the last state, a predetermined heat discharge is given to the variable resistive element, and therefore, there is a problem that a value of voltage to be applied is increased. Further, for example when a certain variable resistive element is selected to switch the resistance state to the high or low resistance state, the heat generated at this time is transferred to the adjacent variable resistive elements through an insulating layer formed of $SiO_2$ and may cause malfunction of non-selected adjacent variable resistive elements.

The application of voltage to the variable resistive element causes diffusion between constituent elements of the variable resistive element and the insulating layer, and there is a problem that the characteristics of the variable resistive element is deteriorated, or current is leaked to the adjacent variable resistive elements through the insulating layer.

Thus, hereinafter, embodiments that can solve the above problems will be described.

In general, according to one embodiment, a non-volatile memory device includes a first wiring extending in a first direction, a second wiring provided at different height from the first wiring and extending in a second direction, and a variable resistance memory cell which is disposed at an intersection between the first wiring and the second wiring so as to be held between the first wiring and the second wiring and includes a variable resistive element and a rectifying element. In spaces between the variable resistance memory cells adjacent to each other, at least a periphery of the variable resistive element is evacuated or filled with a gas.

Hereinafter, exemplary embodiments of a non-volatile memory device will be explained in detail with reference to the accompanying drawings. The present invention is not limited to the following embodiments. The cross-sectional views of the non-volatile memory device used in the following embodiments are schematic, and the relationship between thickness and width of each layer and the ratio of the thickness of each layer are different from the actual one. The following each film thickness is an example, and the present invention is not limited to this.

(First Embodiment)

Figure 1A:
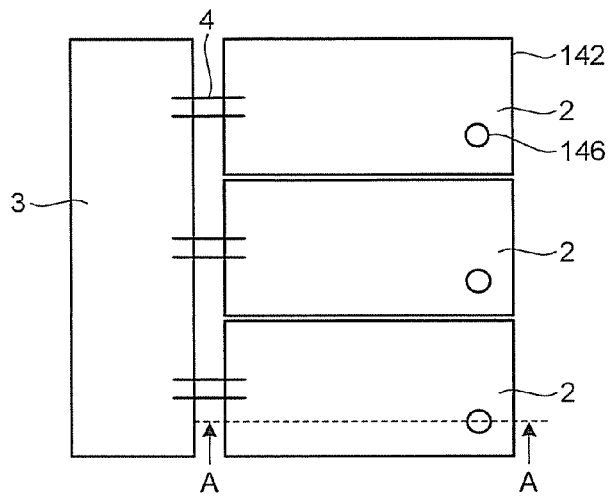
FIG. 1A is a top view schematically showing an example of a constitution of a non-volatile memory device according to a first embodiment.
Figure 1B:
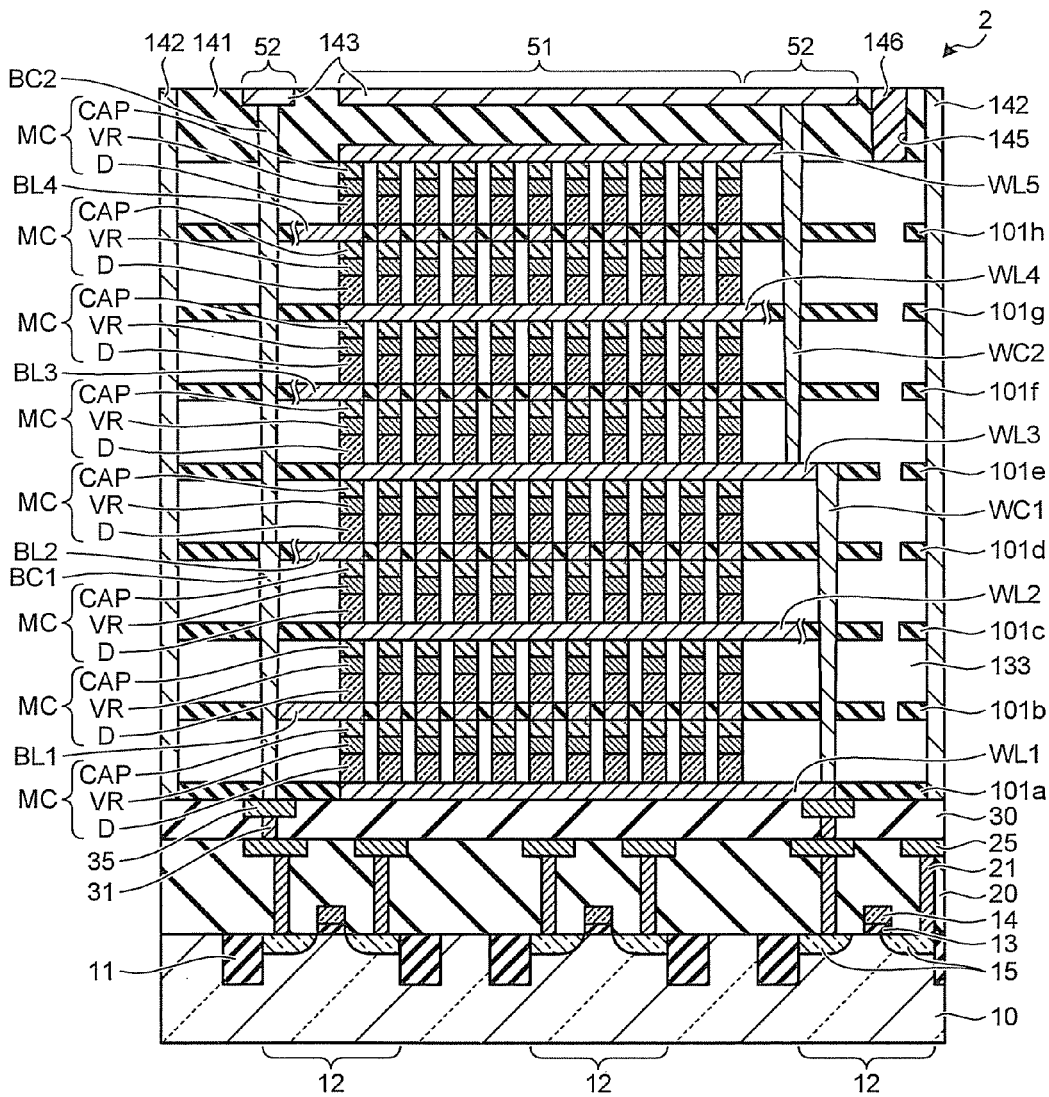
FIG. 1B is an A-A cross-sectional view of FIG. 1A.

FIGS. 1A and 1B are views schematically showing an example of a constitution of a non-volatile memory device according to a first embodiment. FIG. 1A is a top view of the non-volatile memory device. FIG. 1B is an A-A cross-sectional view of FIG. 1A.

As shown in FIG. 1A, the non-volatile memory device has cell arrays 2, a peripheral circuit 3, and wirings 4 through which the cell arrays 2 and the peripheral circuit 3 are connected to each other. In the cell array 2, a memory cell of a variable resistance memory as the non-volatile memory is formed on a substrate such as a semiconductor substrate. The peripheral circuit 3 performs control of write-in and read-out of the memory cell of the cell array 2. FIG. 1A shows a case where three cell arrays 2 are provided. The periphery of each of the cell arrays 2 is surrounded by a guard ring 142.

FIG. 1B shows the state of the cross section of one of the cell arrays. As shown in FIG. 1B, the cell array 2 is formed on underlying circuits such as cell control transistors 12 which control a memory cell MC formed on a semiconductor substrate 10 such as a silicon substrate. The cell control transistor 12 has a gate electrode 14 and a source/drain region 15. The gate electrode 14 is formed in a region, partitioned with element separation insulating films 11 on the semiconductor substrate 10, through a gate insulating film 13. The source/drain region 15 is formed on a surface of the semiconductor substrate 10 on both sides in a line width direction of the gate electrode 14. A first inter-layer insulating film 20 is formed on the semiconductor substrate 10 formed with the cell control transistors 12, and first wirings 25 are formed to be embedded in the first inter-layer insulating film 20 near the upper surface of the first inter-layer insulating film 20. The first wiring 25 is connected to the source/drain region 15 of the cell control transistor 12 through a contact 21 provided in the first inter-layer insulating film 20. A second inter-layer insulating film 30 is formed on the first inter-layer insulating film 20, and second wirings 35 are formed to be embedded in the second inter-layer insulating film 30 near the upper surface of the second inter-layer insulating film 30. The second wiring 35 is connected to the first wiring 25 through a via 31 formed in the second inter-layer insulating film 30. A memory cell portion 51 having the memory cells MC is formed on the second inter-layer insulating film 30. A third inter-layer insulating film 141 is formed at the upper portion of the memory cell portion 51, and third wirings 143 are formed to be embedded in the third inter-layer insulating film 141 near the upper surface of the third inter-layer insulating film 141.

In the memory cell portion 51, a plurality of word lines WL extending in a first direction and a plurality of bit lines BL provided at different height from the word lines WL and extending in a second direction perpendicular to the first direction are arranged on the second inter-layer insulating film 30 so as to intersect each other. The memory cell portion 51 further includes the variable resistance memory cells (hereinafter also referred to simply as memory cells) MC in which a rectifying element D and a variable resistive element VR are connected in series, and the variable resistance memory cell MC is disposed at each of the intersections between the word lines WL and the bit lines BL. The word lines WL and the bit lines BL are alternately formed in the height direction of the memory cell portion 51, and the memory cell MC is formed at each of the intersections between the word lines WL and the bit lines BL. Namely, the memory cells MC adjacent to each other in the height direction share the word line WL or the bit line BL. In the following example, the eight memory cells MC are stacked. Hereinafter, a group of the memory cells MC provided at the same height is referred to as a memory layer.

The memory cell portion 15 has on its periphery a contact forming portion 52 which includes a plurality of contacts WC and BC connected to each wiring of each of the memory cells MC. The contacts WC and BC are formed of an electrically-conducting material connecting between the second wirings 35 and the third wirings 143, which are disposed in the upper portion of the third inter-layer insulating film 141 so as to correspond to the formation position of the second wiring 35. A contact connected to the word line WL is referred to as a word line contact WC, and a contact connected to the bit line BL is referred to as a bit line contact BC. In the following examples, if it is not necessary to distinguish the two contacts, the contacts are referred to as the contacts WC and BC.

In the example of FIG. 1B, the word line contacts WC1 and WC2 connected to the word lines WL1 to WL5 are provided on the right side of the memory cell portion 51, and the bit line contacts BC1 and BC2 connected to the bit lines BL1 to BL4 are formed on the left side of the memory cell portion 51. In this example, although the word lines WL1, WL3, and WL5 are connected to the word line contacts WC1 and WC2, the word lines WL2 and WL4 are connected to another word line contacts (not shown). The word line contact WC1 is provided so as to penetrate through the first to fourth memory layers from the bottom, so that the word line contact WC1 is connected to the word lines WL1 to WL3 of the first to fifth memory cells MC from the bottom. The word line contact WC2 is provided so as to penetrate from the third inter-layer insulating film 141 to the fifth memory layer from the bottom, so that the word line contact WC2 is connected to the word lines WL4 and WL5 of the sixth to eighth memory cells MC from the bottom. The word line contacts WC1 and WC2 are connected to each other through the word line WL3.

Each of the bit lines BL1 to BL4 is typically connected to a different bit line contact BC. In the example of FIG. 1B, the bit line BL1 is connected to the bit line contacts BC1 and BC2, and each of the bit lines BL2 and BL3 is connected to a different bit line contact (not shown). The bit line contact BC1 is provided so as to penetrate through the first to third memory layers from the bottom, so that the bit line contact BC1 is connected to the bit lines BL1 and BL2 of the first to fourth memory cells MC from the bottom. The bit line contact BC2 is provided so as to penetrate from the third inter-layer insulating film 141 to the fourth memory layer from the bottom, so that the bit line contact BC2 is connected to the bit lines BL3 and BL4 of the fifth to eighth memory cells MC from the bottom. The bit line contacts BC1 and BC2 are connected to each other at the formation position of the bit line BL2.

The guard ring 142 is formed so as to surround the peripheries of the memory cell portion 51 and the contact forming portion 52. Supporting films 101a to 101h each made of an insulating film are formed at the formation positions (the height) of the word lines WL1 to WL5 and the bit lines BL1 to BL4. The ends of the supporting films 101a to 101h are connected to the guard ring 142. The guard ring 142 as a pillar supports the supporting films 101a to 101h. As described later, a region around the memory cell MC, where at least a variable resistive layer is included is a void. In the example of FIG. 1B, a region where the vertically adjacent support films 101a to 101h are included and the memory cells MC are not formed is a void 133. A through hole 145 for removing a sacrifice. layer to form a void around at least the variable resistive layer is provided at predetermined positions of the third inter-layer insulating film 141 and the supporting films 101b to 101h so as to penetrate through each layer. The through hole 145 of the third inter-layer insulating film 141 has a sealing layer 146. The sealing layer 146 is formed of an organic material film such as polyimide or an insulating film such as a silicon oxide film and a silicon nitride film.

The cell array 2 includes the void 133 provided except for the memory cell formation position between the word line formation position and the bit line formation position and the contact formation position. The inside of the cell array 2 is hermetically-sealed by the semiconductor substrate 10 (the second inter-layer insulating film 30), the guard ring 142, the third inter-layer insulating film 141, and the sealing layer 146 embedded in the through hole 145 of the third inter-layer insulating film 141.

Figure 2:
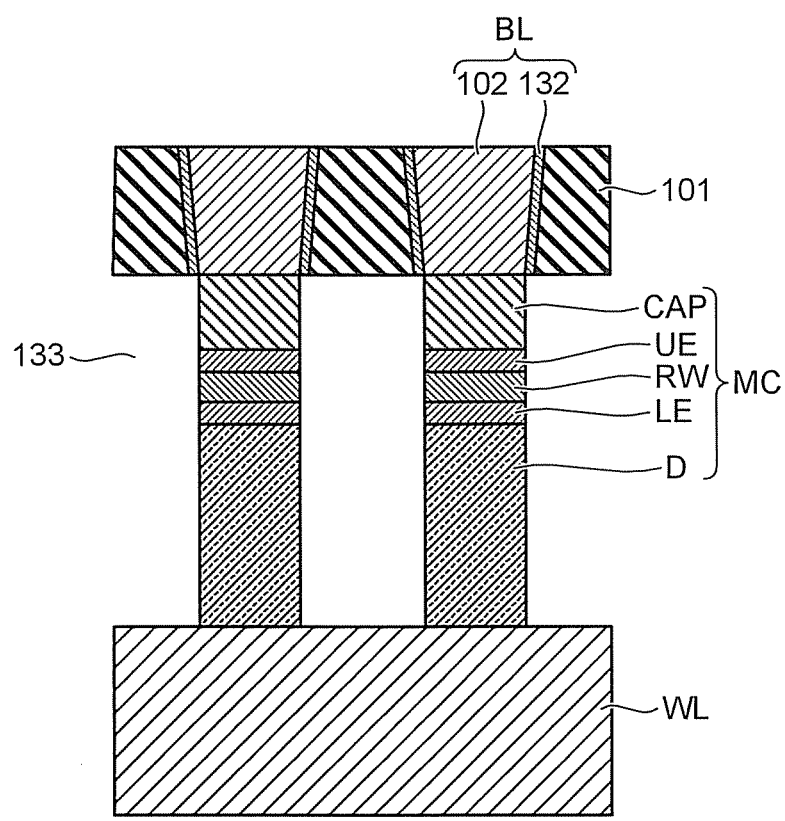
FIG. 2 is a cross-sectional view schematically showing an example of a constitution of a memory cell of the non-volatile memory device according to the first embodiment.

FIG. 2 is a cross-sectional view schematically showing an example of a constitution of the memory cell of the non-volatile memory device according to the first embodiment. FIG. 2 is a partially exploded view of the memory cell MC of FIG. 1B. As shown in FIG. 2, the memory cell MC has a constitution in which a stacking structure comprising the rectifying element D, the variable resistive element VR, and a cap film CAP is provided at the intersections between the word line WL and the bit line BL. The word line WL and the bit line BL include a wiring material film 102 formed to be embedded in the supporting film 101, which is made of an electrically-conducting material such as W, and a barrier metal film 132 provided for preventing diffusion between the wiring material film 102 and the supporting film 101 and made of, for example, TiN.

The rectifying element D is made of a material having a rectification such as a shotkey diode, a PN junction diode, and a PIN diode. In the following example, the rectifying element D is constituted of a polycrystalline silicon layer of a PIN structure, for example. The rectifying element D is set so as to flow a current from the bit line BL toward the word line WL by changing the stacking order.

The variable resistive element VR has a variable resistive layer RW and upper and lower electrode layers UE and LE vertically holding the variable resistive layer RW in between. The variable resistive layer RW is constituted of a metal oxide which can switch the resistance state between the high resistance state and the low resistance state according to control of a voltage value and voltage application time. The variable resistive layer RW may be made of, for example, a metal oxide such as MnO, ZnO, NiO, and CoO or a compound having a perovskite-type structure or a spinel structure. The upper and lower electrode layers UE and LE are formed of a material which does not react with the variable resistive layer RW to lose the variable resistivity of the variable resistive layer RW. The upper and lower electrode layers UE and LE may be made of a metal nitride such as Ti, W, Mo, and Ta. The upper and lower electrode layers UE and LE may be omitted in some cases. In the following example, the variable resistive layer RW is formed of a NiO film.

The cap film CAP is formed of an electrically-conducting material such as W introduced in process for the purpose of connecting the memory cell MC and the upper word line WL or bit line BL. In this example, although the rectifying element D and the variable resistive element VR are stacked in this order from the bottom, the variable resistive element VR and the rectifying element D may be stacked in this order from the bottom.

As described above, unlike the conventional art, no insulating film is formed around the stacking structure comprising the rectifying element D, the variable resistive element VR, and the cap film CAP, and the void 133 is provided. The void 133 is in a vacuum state or a state of being filled with a gas with a lower thermal conductivity than that of an insulating film such as $SiO_2$ filled between the memory cells MC in the conventional art structure. As the gas filled in the void 133, an inert gas such as Ar and $N_2$ or an insulating gas capable of interrupting discharge, such as $SF_6$ is preferably used. In the following example, the void 133 is filled with $N_2$. It is preferable that a gas does not include water vapor.

In comparison with the conventional art case where the periphery of the memory cell MC is filled with the insulating film formed of $SiO_2$, the thermal conductivity of nitrogen $N_2$ is 0.0258 W/m·K, and the value is much smaller than the thermal conductivity of $SiO_2$ that is 1.38 W/m·K. Accordingly, heat generated in the variable resistive layer RW is hardly transferred to the periphery of the memory cell MC in comparison with the case where the periphery of the memory cell MC is filled with the insulating film, and reduction in temperature of the variable resistive layer RW is reduced for a predetermined time after the switching processing between the high resistance state and the low resistance state. Namely, the temperature of the variable resistive layer RW can be kept in comparison with the conventional art.

Figure 3A:
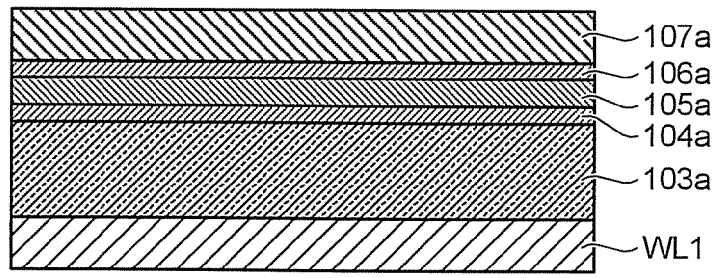
FIGS. 3A to 3R are cross-sectional views schematically showing an example of a procedure of a method of manufacturing the non-volatile memory device according to the first embodiment.

Next, a method of manufacturing a non-volatile memory device having the above structure will be described. FIGS. 3A to 3R are cross-sectional views schematically showing an example of a procedure of the method of manufacturing the non-volatile memory device according to the first embodiment. In FIGS. 3A to 3K, in order to describe a specific manufacturing method in the memory cell portion 51, the memory cell portion 51 is partially enlarged. FIG. 3L and the subsequent drawings show a specific manufacturing method in the entire cell array 2.

First, the lower structure of the first supporting film 101a and the word line WL1 of FIG. 1B is formed. Namely, a first inter-layer insulating film is formed on a semiconductor substrate (not shown) formed with cell control transistors, and a first wiring connected to the cell control transistor through a contact is formed in the first inter-layer insulating film. Subsequently, a second inter-layer insulating film is formed on the first inter-layer insulating film, and a second wiring connected to the first wiring through a via is formed in the second inter-layer insulating film. Then, a first supporting film formed of an insulating film such as a $SiO_2$ film is formed on the second inter-layer insulating film formed with the second wiring, and the word line WL1 is formed at the first supporting film by a damascene method. Specifically, a trench for wiring formation which extends in the first direction is formed in the first supporting film, and a barrier metal film formed of, for example, a TiN film is formed in the wiring-forming trench so as to cover the inner surface of the wiring-forming trench. Thereafter, a wiring material film formed of, for example, W is formed, and then the wiring material film and the barrier metal film are removed by, for example, a Chemical Mechanical Polishing (CMP) method so that the first supporting film is exposed, whereby the word line WL1 is formed.

Subsequently, as shown in FIG. 3A, a semiconductor layer 103a which is the base of the rectifying element D, a lower electrode layer 104a, a variable resistive layer 105a, an upper electrode layer 106a, and a cap film 107a are sequentially formed on the first supporting film (not shown), formed with the word line WL1, by a film-formation method such as sputtering and chemical Vapor Deposition (CVD). As the semiconductor layer 103a, a polycrystalline silicon layer of a PIN structure may be used, for example. As the lower electrode layer 104a and the upper electrode layer 106a, a TiN film may be used, for example. As the variable resistive layer 105a, a NiO film may be used, for example.

Figure 3B:
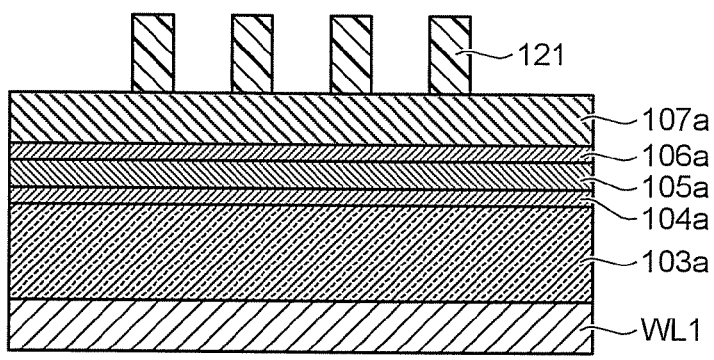

Subsequently, as shown in FIG. 3B, a resist 121 is coated on the cap film 107a to be patterned to a predetermined pattern by using a lithography technique, and, thus, to form a mask. In this case, the patterning is formed so that the columnar resists 121 are arranged at predetermined intervals at the formation position of the word line WL1.

Figure 3C:
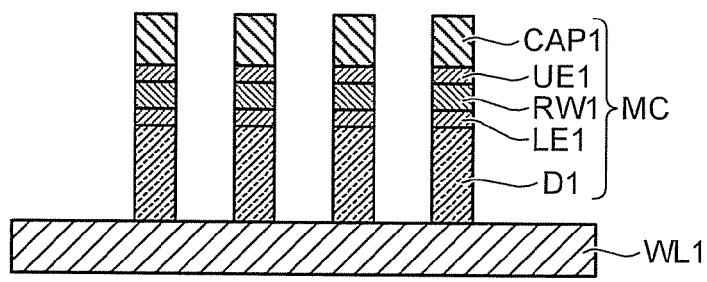

Thereafter, as shown in FIG. 3C, the cap film 107a through the semiconductor layer 103a are processed by anisotropic etching such as Reactive Ion Etching (RIE), using the patterned resist 121 as a mask, so that there are obtained the memory cells MC in which a rectifying element D1, a lower electrode layer LE1, a variable resistive layer RW1, an upper electrode layer UE1, and a cap film CAP1 are stacked sequentially from the bottom at predetermined intervals to be processed into a columnar structure. Consequently, a memory cell array pattern in which the memory cells MC are matrix-like arranged on the word line WL1 is formed. After etching, the resist 121 is removed.

Figure 3D:
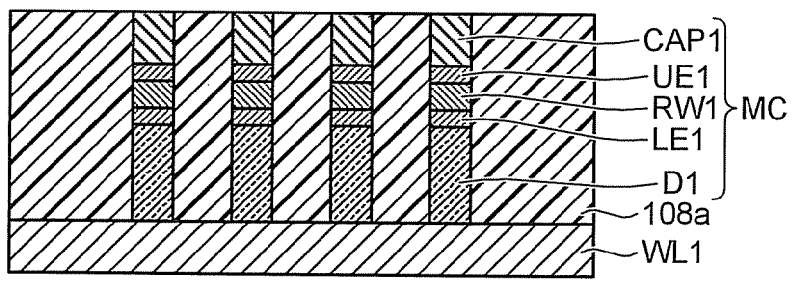

Then, as shown in FIG. 3D, a sacrifice layer 108a is formed so as to fill a space between the memory cells MC. As the sacrifice layer 108a, an organic material such as polyimide may be used. After the formation of the sacrifice layer 108a, the sacrifice layer 108a formed to have a thickness larger than the upper surface of the cap film CAP1 is removed until the upper surface of the cap film CAP1 is exposed.

Figure 3E:
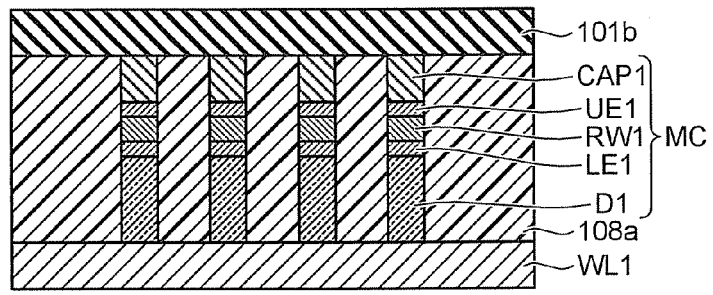
Figure 3F:
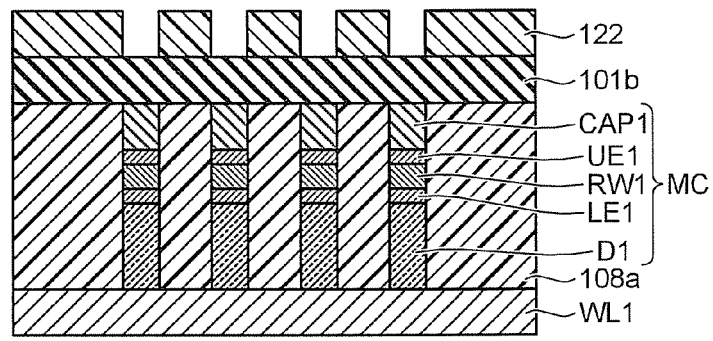

Subsequently, as shown in FIG. 3E, a second supporting film 101b is formed on the sacrifice layer 108a having the cap film CAP1 whose upper surface is exposed. Further, as shown in FIG. 3F, a resist 122 is coated on the second supporting film 101b to be patterned into a shape of a trench for formation of the bit line by using a lithography technique, and, thus, to form a mask. In this case, the patterning is performed so that an unmasked portion overlaps the formation position of the memory cell MC provided under the unmasked portion.

Figure 3G:
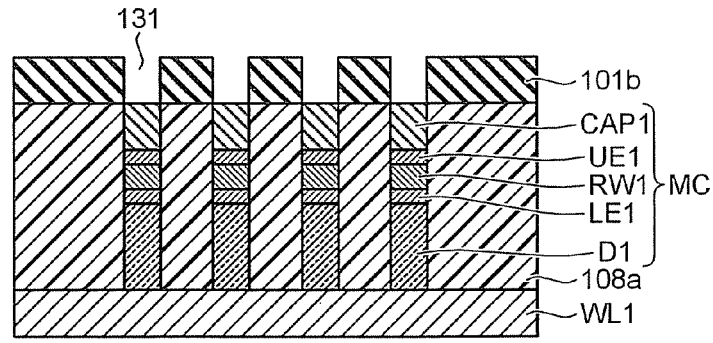

Thereafter, as shown in FIG. 3G, the second supporting film 101b is etched by an etching technique such as RIE, using the resist 122 as a mask. In this case, the etching is performed using the cap film CAP1 as a stopper. Consequently, wiring-forming trenches 131 for formation of the bit line are formed. After the formation of the wiring-forming trenches 131, the resist 122 is removed.

Figure 3H:
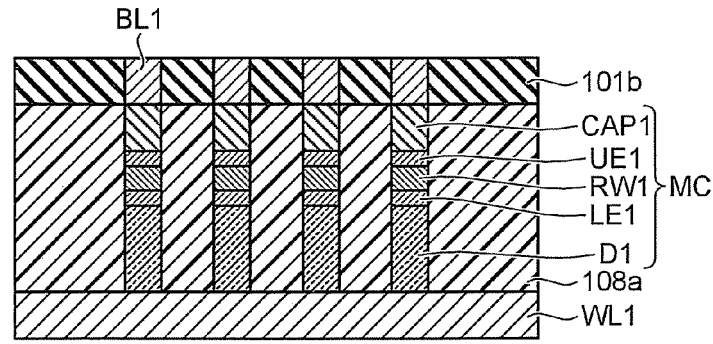

Subsequently, as shown in FIG. 3H, an electrically-conducting material is embedded in the wiring-forming trench 131, and the bit line BL1 is formed. For example, a barrier metal film formed of, for example, a TiN film is formed by plating or the like so as to cover the inner surface of the wiring-forming trench 131, and then, a wiring material film formed of, for example, W is formed. Thereafter, the wiring material film and the barrier metal film are removed by, for example, a CMP method so that the second supporting film 101b is exposed between the wiring-forming trenches 131, whereby the bit line BL1 is formed. According to the above constitution, a first memory layer is formed.

Figure 3I:
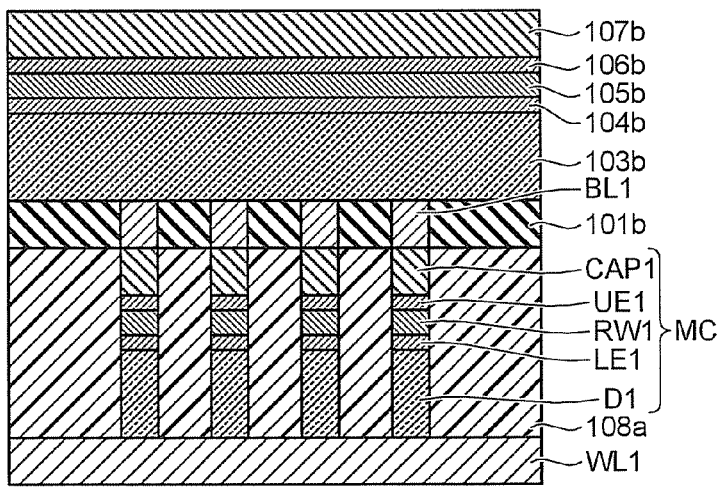

Subsequently, as shown in FIG. 3I, a semiconductor layer 103b which is the base of the rectifying element D, a lower electrode layer 104b, a variable resistive layer 105b, an upper electrode layer 106b, and a cap film 107b are sequentially formed on the second supporting film 101b formed with the bit line BL1 by a film-formation method such as sputtering and CVD. As in the above case, as the semiconductor layer 103b, a polycrystalline silicon layer of a PIN structure may be used, for example. However, in this case, the PIN structure is formed in the opposite order to the order of the PIN formed in the semiconductor layer 103a in the first memory layer. As the lower electrode layer 104b and the upper electrode layer 106b, a TiN film may be used, for example. As the variable resistive layer 105b, a NiO film may be used, for example.

Figure 3J:
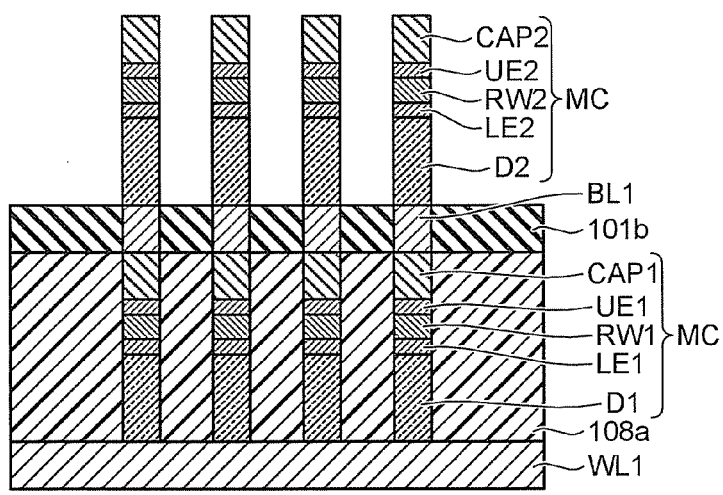

Subsequently, as shown in FIG. 3J, the cap film 107b through the semiconductor layer 103b are processed by the etching technique such as RIE, using, as a mask, a resist (not shown) coated on the cap film 107b to be patterned into a desired shape. According to this constitution, there are obtained the memory cells MC in which a rectifying element D2, a lower electrode layer LE2, a variable resistive layer RW2, upper electrode layer UE2, and a cap film CAP2 are stacked sequentially from the bottom to be processed into a columnar structure. Consequently, the memory cell array pattern in which the memory cells MC are matrix-like arranged on the bit line BL1 at predetermined intervals is formed. The memory cell MC formed herein is formed to correspond to the formation position of the memory cell MC of the first memory layer.

Figure 3K:
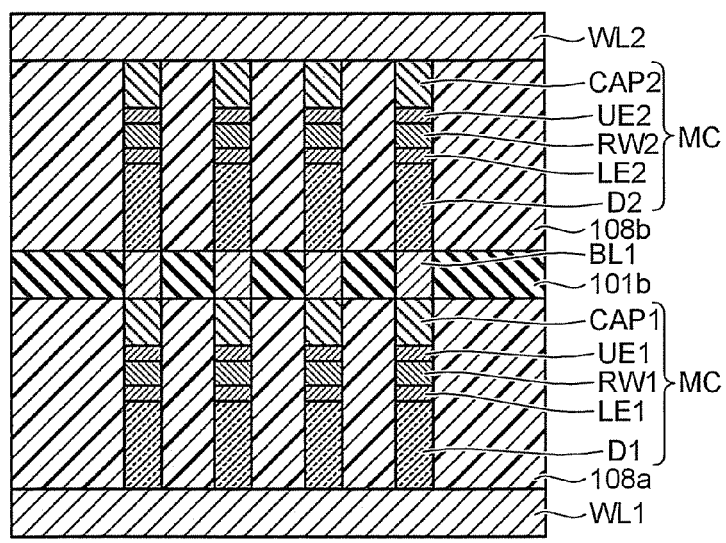
Figure 3L:
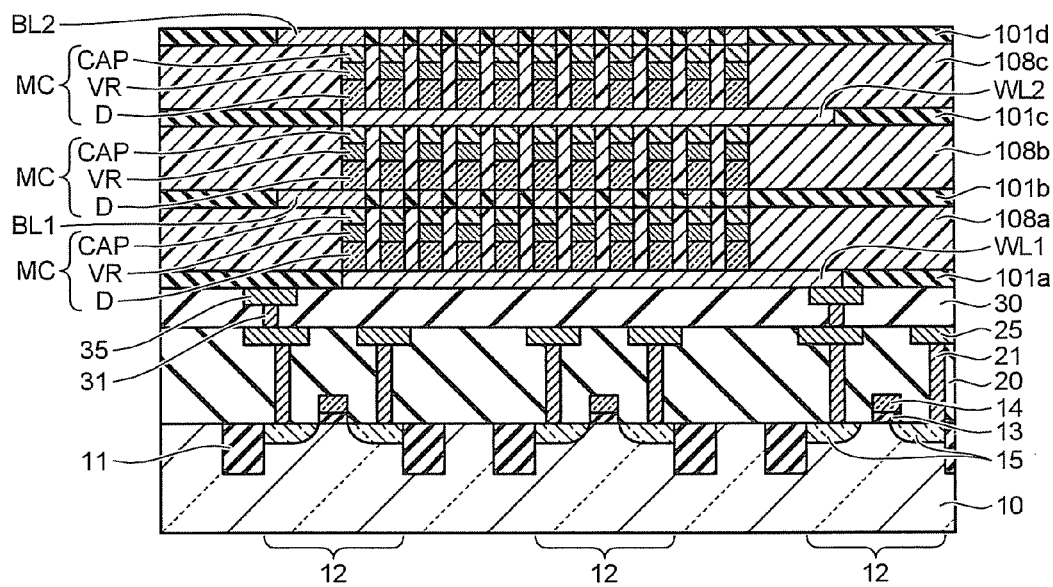

Thereafter, as shown in FIG. 3K, a sacrifice layer 108b formed of an organic material such as polyimide is formed so as to fill a space between the memory cells MC and expose the upper surface of the cap film CAP2. Then, a third supporting film (not shown) is formed on the sacrifice layer 108b having the cap film CAP2 whose upper surface is exposed. Subsequently, a resist is coated on the third supporting film, and a mask used for formation of a trench for formation of the word line is formed using a lithography technique. The third supporting film is etched by the etching technique such as RIE, using the mask until the cap film CAP2 is exposed. According to this constitution, the trench for formation of the word line is formed. A barrier metal film and a wiring material film are embedded in the wiring-forming trench, whereby the word line WL2 is formed. According to the above constitution, a second memory layer is formed.

Figure 3M:
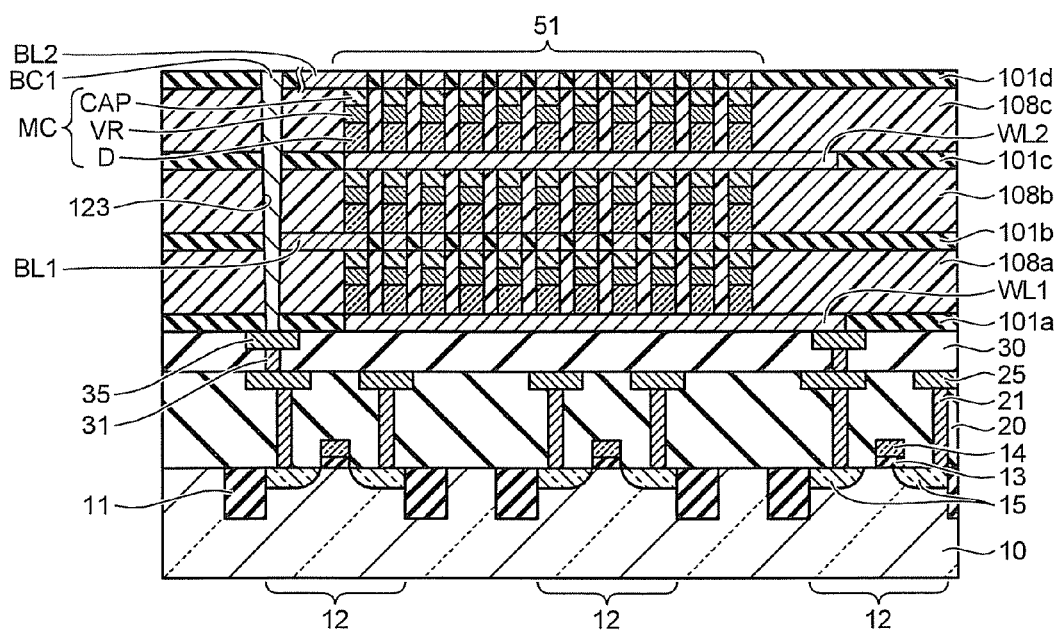

Subsequently, as shown in FIG. 3L, using a procedure similar to that described above, a third memory layer is formed on a third supporting film 101c having the word line WL2 whose upper surface is exposed. A fourth supporting film 101d and the bit line BL2 are formed on the third memory layer. Thereafter, as shown in FIG. 3M, a contact hole 123 penetrating from the fourth supporting film 101d to the first supporting film 101a is formed in a region other than the formation position of the memory cell MC, using the lithography technique and the etching technique. An electrically-conducting material such as W is embedded in the contact hole 123, and the bit line contact BC1 is formed. The bit line contact BC1 is formed in a region, where the bit line BL1 is drawn from the memory cell portion 51, so as to be connected to the bit lines BL. Although not illustrated, the bit line contact connected to the bit line BL2 and the bit line contacts connected to the bit lines BL3 and BL4 to be formed later are formed in a similar manner.

Figure 3N:
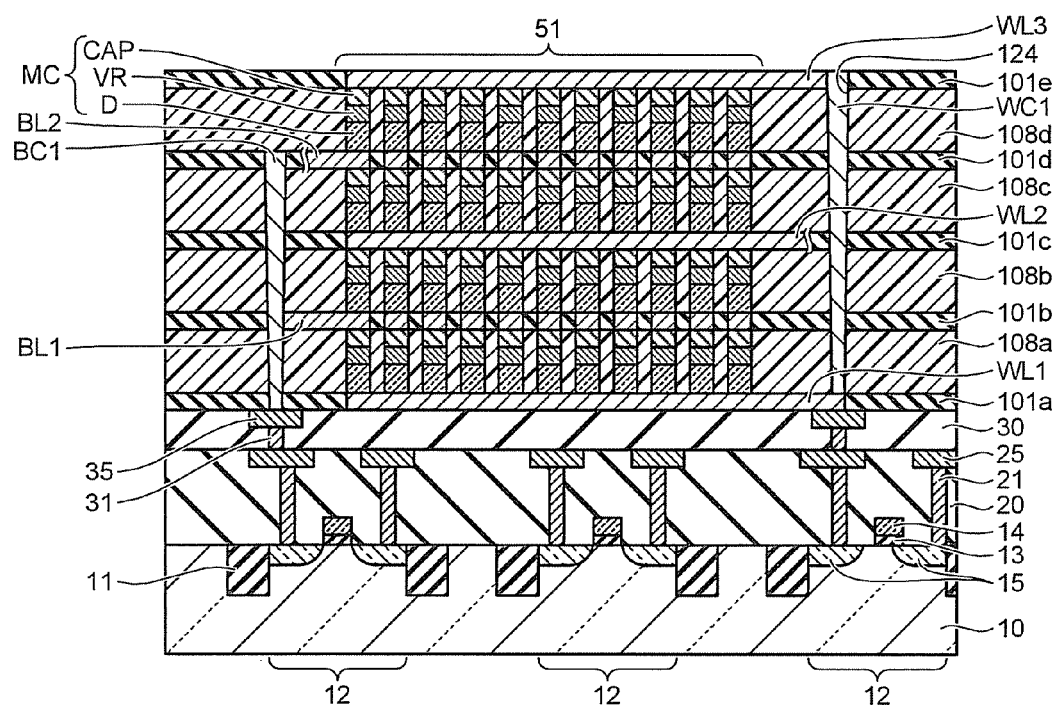

Subsequently, as shown in FIG. 3N, using a procedure similar to that described above, a fifth memory layer is formed on the fourth supporting film 101d having the bit line BL2 whose upper surface is exposed. A fifth supporting film 101e and the word line WL3 are formed on the fifth memory layer. Thereafter, a contact hole 124 penetrating from the fifth supporting film 101e to the first sacrifice layer 108a and reaching the word line WL1 is formed in a region other than the formation position of the memory cell MC, using the lithography technique and the etching technique. An electrically-conducting material such as W is embedded in the contact hole 124 to form the word line contact WC1. The word line contact WC1 is formed in a region, where the word lines WL1 and WL3 are drawn from the memory cell portion 51, so as to be connected to the word lines WL1 and WL3. Although not illustrated, the word line contact connected to the word line WL2 is formed in a similar manner.

Figure 3O:
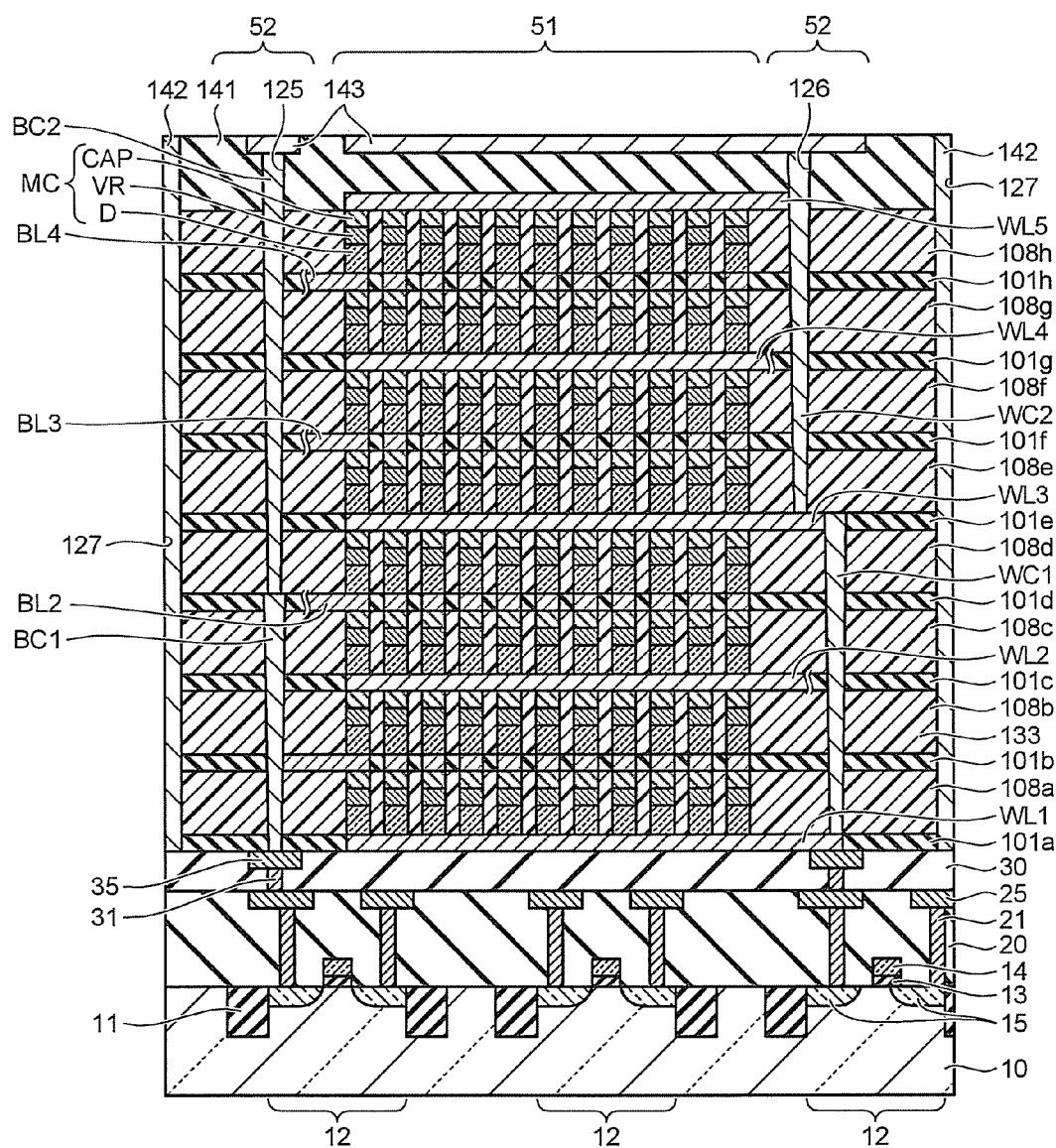

Thereafter, as shown in FIG. 3O, the fifth to eighth memory layers are formed on the fifth supporting film 101e having the word line WL3 whose upper surface is exposed. Then, the word line WL5 and the third inter-layer insulating film 141 are formed on the uppermost memory layer. Thereafter, a contact hole 125 communicating with the bit line contact BC1 is formed using the lithography technique and the etching technique. An electrically-conducting material is embedded in the contact hole 125 to form the bit line contact BC2. Simultaneously with the formation of the bit line contact BC2, the bit line contacts which are connected to the bit line contacts already formed corresponding to the other bit lines BL2 to BL4 are formed. Likewise, a contact hole 126 communicating with the word line WL3 drawn from the memory cell portion 51 is formed, and an electrically-conducting material such as W is embedded in the contact hole 126 to form the word line contact WC2. The word line contact WC2 is connected to the word lines WL3 and WL5. Simultaneously with the formation of the word line contact WC2, the word line contacts which are connected to the word line contacts already formed corresponding to the other word lines WL2 and WL4 are formed.

Further, a trench 127 surrounding the peripheries of the memory cell portion 51 and the contact forming portion 52 is formed using the lithography technique and the etching technique, and an electrically-conducting material is embedded in the trench 127 to form the guard ring 142. A region surrounded by the guard ring 142 is one cell array. Then, the wiring 143 connected to the word line contact WC2 and the bit line contact BC2 is formed on the upper surface of the third inter-layer insulating film 141 by, for example, the damascene method.

Figure 3P:
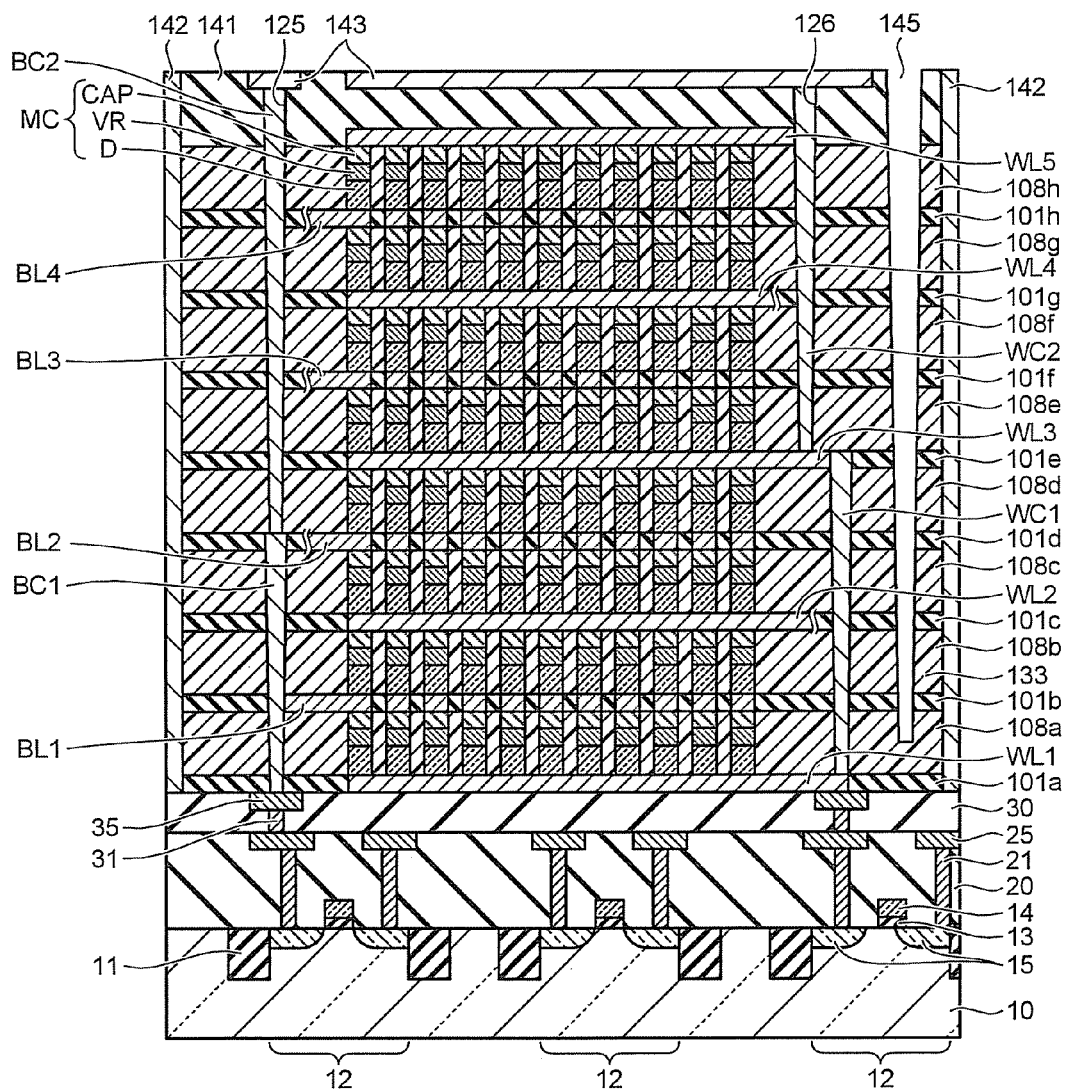

Subsequently, as shown in FIG. 3P, the through hole 145 for removing a sacrifice layer is formed at a position in the region surrounded by the guard ring 142, where the memory cell MC and the contacts WC and BC are not formed, using the lithography technique and the etching technique. The through hole 145 is formed from the third inter-layer insulating film 141 to a depth reaching the sacrifice layer 108a.

Figure 3Q:
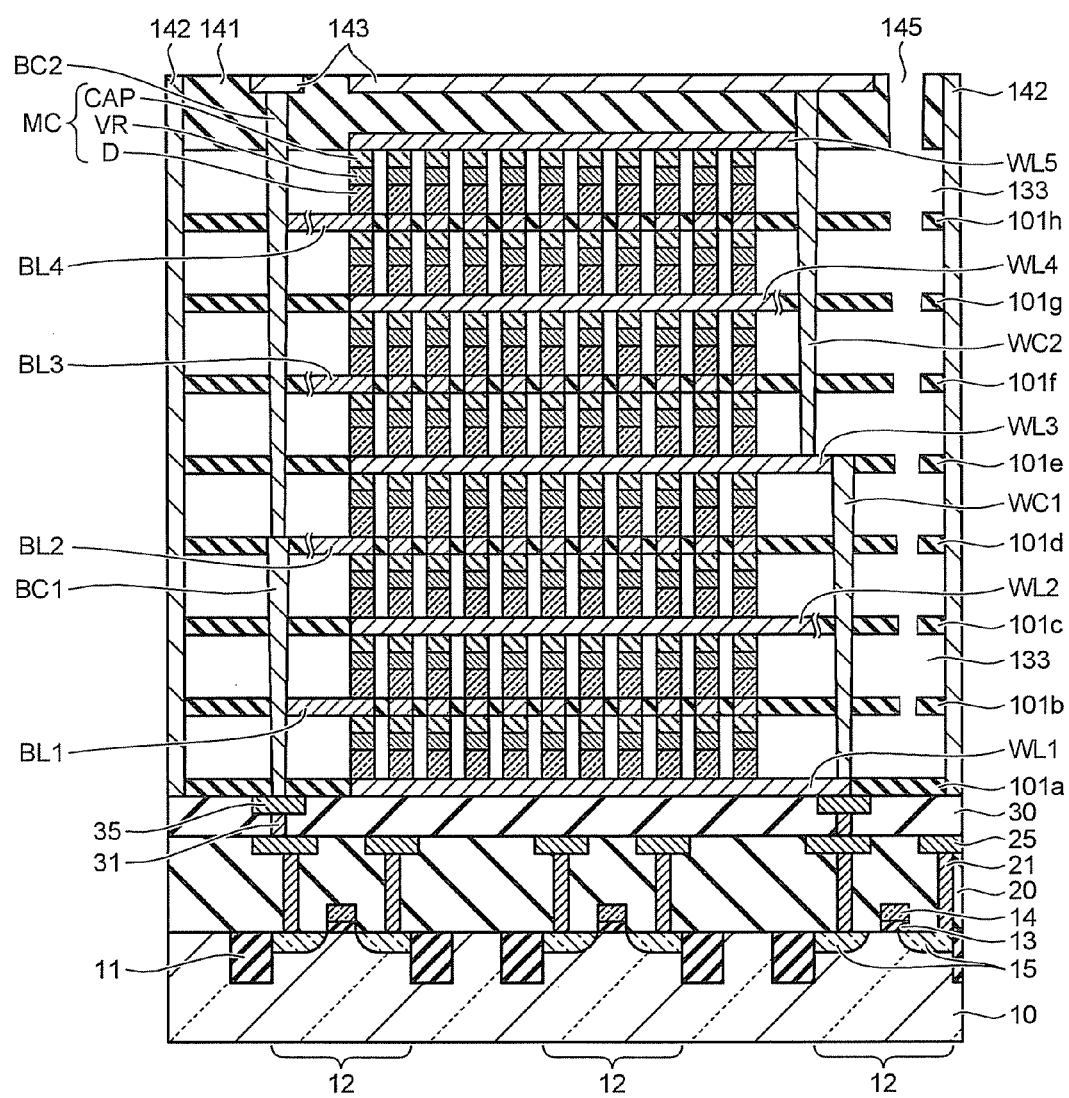
Figure 3R:
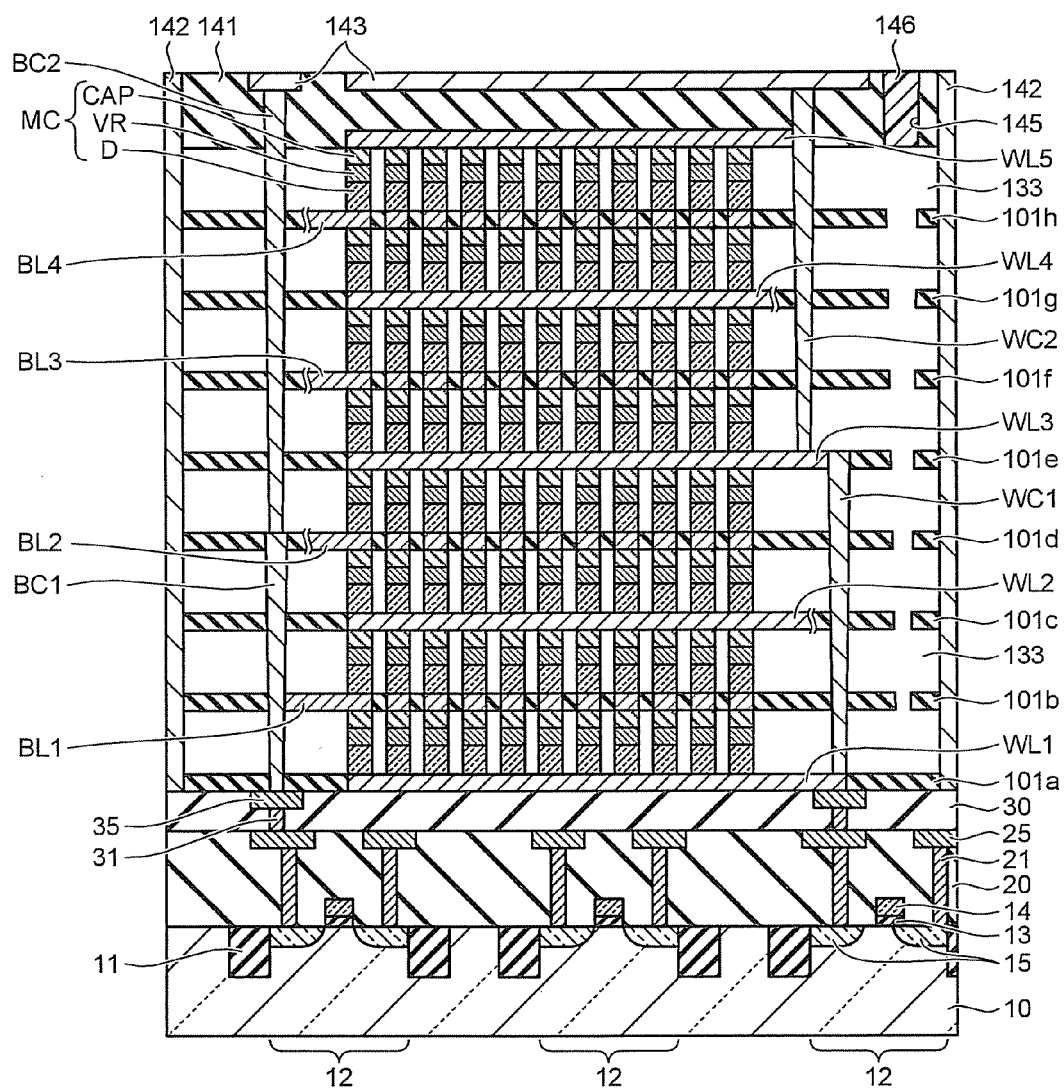

Thereafter, as shown in FIG. 3Q, the first to eighth sacrifice layers 108a to 108h existing between the first supporting film 101a to the third inter-layer insulating film 141 in the region surrounded by the guard ring 142 are removed by resist stripping using an $O_2$ gas, for example, or wet etching. The region where the first to eighth sacrifice layers 108a to 108h have been removed by the resist stripping processing or the wet etching processing is the void 133. Namely, the void 133 is a space where no solid material exists in the region between the memory cells MC.

Subsequently, as shown in FIG. 3R, the sealing layer 146 is formed so as to seal the through hole 145 formed in the third inter-layer insulating film 141. The sealing layer 146 is formed by coating of an organic material such as polyimide. According to this constitution, the cell array 2 surrounded by the guard ring 142 is sealed. By virtue of the sealing, the void 133 in the region surrounded by the guard ring 142 can be evacuated or filled with an inert gas such as Ar and $N_2$ or an insulating gas such as $SF_6$. According to the above processing processes, the non-volatile memory device shown in FIGS. 1A and 1B is obtained.

According to the first embodiment, the void 133 is formed around the memory cell MC, and the void 133 is evacuated or filled with an inert gas such as Ar and $N_2$ or an insulating gas such as $SF_6$. According to this constitution, in comparison with the conventional art case where the periphery of the memory cell MC is surrounded by the insulating film formed of $SiO_2$, the heat generated in the variable resistive layer RW is hardly transferred peripherally, so that the reduction in temperature of the variable resistive layer RW during operation can be reduced. Consequently, when the switching processing between the high resistance state and the low resistance state is performed in such a state that the temperature of the variable resistive layer RW is high, the state of the variable resistive layer RW can be easily switched, and there is such an effect that power consumption of the non-volatile memory device can be reduced in comparison with the conventional art case.

Since the space between the memory cells MC is evacuated or filled with an inert gas such as Ar and $N_2$ or an insulating gas such as $SF_6$ whose thermal conductivity is lower than that of $SiO_2$, the heat generated in the selected memory cell MC is not transferred to the non-selected memory cells MC adjacent to the selected memory cell MC, so that the non-selected memory cells MC are not heated. Consequently, there is such an effect that it is possible to prevent malfunction caused by the heating of the non-selected memory cells MC.

Since the space between the adjacent memory cells MC is not filled with a solid material, diffusion and reaction between the variable resistive layer RW and the insulating film can be prevented as in the conventional art structure, and, at the same time, there is such an effect that it is possible to prevent current from leaking from the variable resistive layer RW through the insulating film.

(Second Embodiment)

In the first embodiment, a void is provided around all the memory cells, and the void is evacuated or filled with an inert gas such as Ar and $N_2$ or an insulating gas such as $SF_6$. However, to obtain the effects of the first embodiment, an insulating film may not be formed around at least the variable resistive layer. Thus, in a second embodiment, such a case will be described as an example.

Figure 4:
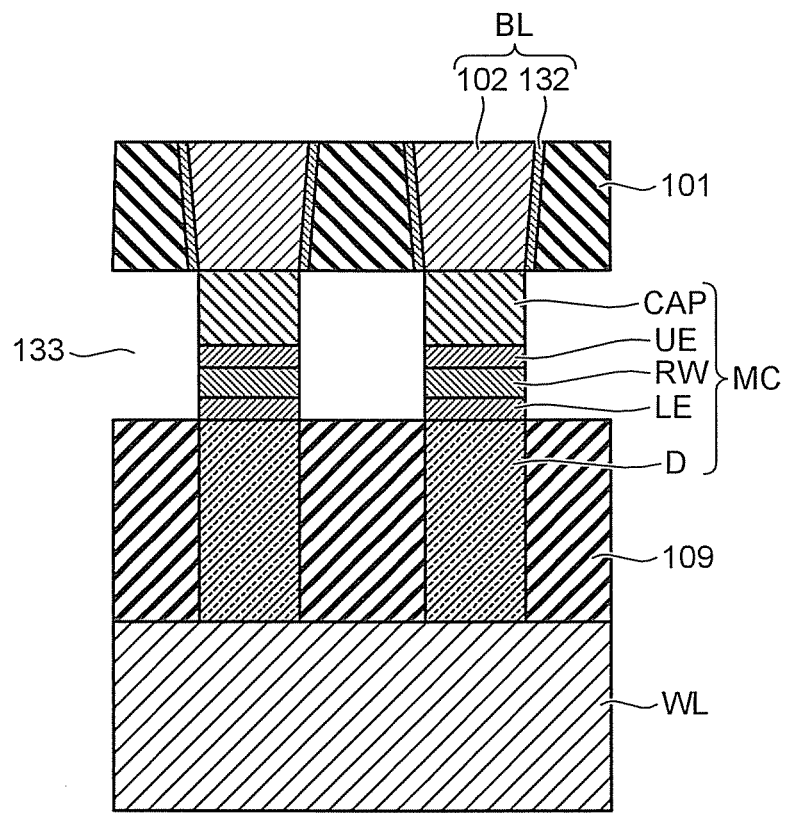
FIG. 4 is a cross-sectional view schematically showing an example of a constitution of a memory cell of a non-volatile memory device according to a second embodiment.

FIG. 4 is a cross-sectional view schematically showing an example of a structure of a memory cell of a non-volatile memory device according to the second embodiment. In the second embodiment, an insulating layer 109 is formed only around a rectifying element D constituting the memory cell MC. The insulating layer 109 is formed so as not to cover the periphery of a variable resistive layer RW. Since the other constitutions are similar to those of the first embodiment, the description will be omitted.

Figure 5:
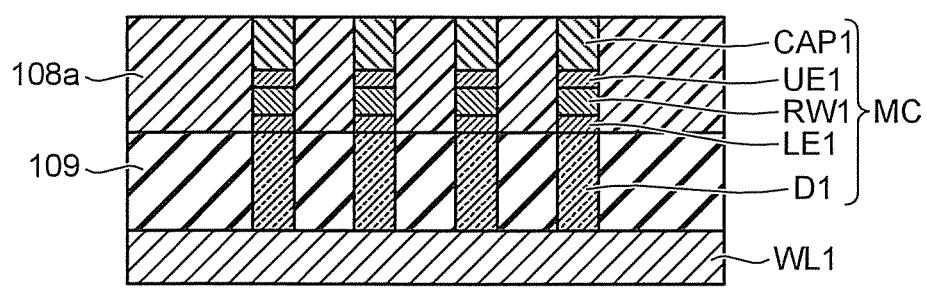
FIG. 5 is a cross-sectional view schematically showing an example of a procedure of a method of manufacturing the non-volatile memory device according to the second embodiment.

A method of manufacturing the non-volatile memory device having the above structure will be described. FIG. 5 is a cross-sectional view schematically showing an example of a procedure of the method of manufacturing the non-volatile memory device according to the second embodiment. First, as shown in FIGS. 3A to 3C, the memory cell MC having a columnar structure in which a rectifying element D1, a lower electrode layer LE1, a variable resistive layer RW1, an upper electrode layer UE1, and a cap film CAP1 are stacked is formed. Thereafter, the insulating layer 109 formed of, for example, $SiO_2$ is formed to embed a space between the memory cells MC. The insulating layer 109 is etched back by, for example, RIE so that the upper surface of the insulating layer 109 is lower in height than the variable resistive layer RW1. According to this constitution, the insulating layer 109 is formed around the rectifying element D1.

Subsequently, the sacrifice layer 108a is formed to embed the space between the memory cells MC. As the sacrifice layer 108a, an organic material such as polyimide may be used. After the formation of the sacrifice layer 108a, the sacrifice layer 108a formed to have a thickness larger than the upper surface of the cap film CAP1 is removed until the upper surface of the cap film CAP1 is exposed. According to this constitution, the sacrifice layer 108a is formed around the variable resistive layer RW1.

Thereafter, the processes similar to the processes of the first embodiment described in FIG. 3E and the subsequent drawings are executed. However, in the formation processes of each memory layer, the insulating layer 109 and the sacrifice layer 108 are formed around the memory cells MC by the method shown in FIG. 5. According to the above constitution, the non-volatile memory device having the structure shown in FIG. 4 is obtained.

Even in the second embodiment, an effect similar to that in the first embodiment can be obtained.

(Third Embodiment)

Figure 6:
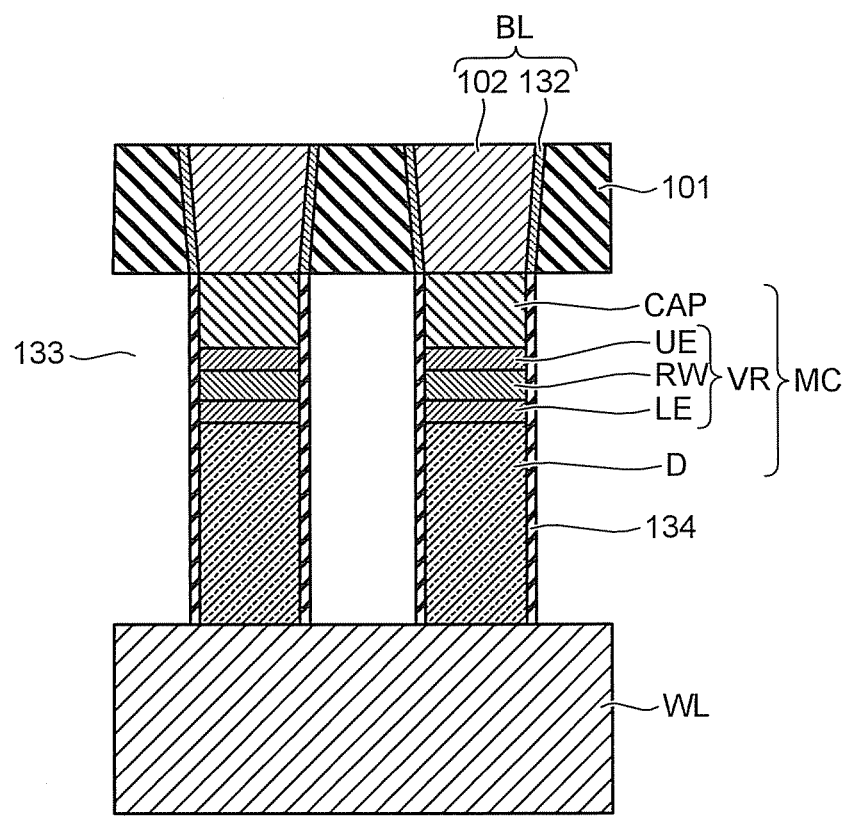
FIG. 6 is a cross-sectional view schematically showing an example of a constitution of a memory cell of a non-volatile memory device according to a third embodiment.

FIG. 6 is a cross-sectional view schematically showing an example of a structure of a memory cell of a non-volatile memory device according to a third embodiment. In the third embodiment, a protective film 134 constituted of, for example, an SiN film covers the peripheries of a rectifying element D, a variable resistive element VR, and a cap film CAP constituting a memory cell MC. As shown in FIG. 6, the protective film 134 is set to have such a thickness that a space between the adjacent memory cells MC is not embedded. When, for example, a component which deteriorates the films constituting the memory cell MC is mixed in a gas filling the space between the memory cells MC, the protective film 134 has a function of preventing the mixed component and the memory cells MC from being in contact with each other. For example, when water vapor is contained in the gas, the protective film 134 is constituted of an SiN film, whereby deterioration of the memory cells MC due to the water vapor can be prevented. Since the other constitutions are similar to those in the first embodiment, the description will be omitted.

Figure 7:
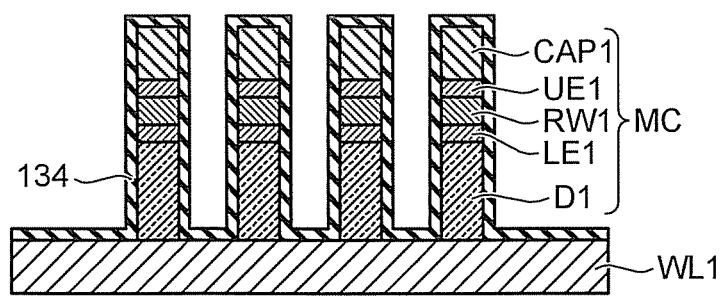
FIG. 7 is a cross-sectional view schematically showing an example of a procedure of a method of manufacturing the non-volatile memory device according to the third embodiment.

The method of manufacturing a non-volatile memory device having the above structure will be described. FIG. 7 is a cross-sectional view schematically showing an example of a procedure of the method of manufacturing the non-volatile memory device according to the third embodiment. First, as shown in FIGS. 3A to 3C, the memory cell MC having a columnar structure in which a rectifying element D1, a lower electrode layer LE1, a variable resistive layer RW1, an upper electrode layer UE1, and a cap film CAP1 are stacked is formed on a word line WL1. Thereafter, the protective film 134 formed of, for example, SiN is formed by a film-formation method such as CVD so as to cover the side surface of the columnar-structured memory cell MC. Then, the upper surface of the memory cell and the protective film 134 formed on the word line WL1 between the memory cells MC are removed by etching back. According to this constitution, the protective film 134 is formed on the side surface of the memory cell MC.

Thereafter, the processes similar to the processes of the first embodiment described in FIG. 3D and the subsequent drawings are executed. However, in the formation processes of each memory layer, the protective film 134 is formed on the side surface of the memory cells MC by the method shown in FIG. 7. According to the above constitution, the non-volatile memory device having the structure shown in FIG. 6 is obtained.

In the third embodiment, since the periphery of the memory cells MC is covered by the protective film 134, if the component which deteriorates the films constituting the memory cells MC is mixed in the void 133 between the memory cells MC, the deterioration of the memory cells MC can be prevented. According to the third embodiment, both the above effect and the effect of the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory device comprising:
a first wiring extending in a first direction;
a plurality of second wirings provided at different height from the first wiring and extending in a second direction;
a memory layer in which a plurality of variable resistance memory cells including a variable resistive element and a rectifying element are arranged at intersections between the first wiring and the second wirings so as to be held between the first wiring and the second wirings;
a guard ring layer surrounding a periphery of the memory layer; and
an insulating layer provided in an upper layer of the memory layer and covering a region surrounded by the guard ring layer,
wherein in a space between the variable resistance memory cells adjacent to each other, at least a region near the variable resistive element is evacuated or filled with a gas.

2. The non-volatile memory device according to claim 1, wherein the first and second wirings are supported by a supporting film comprising an insulating film, which has substantially the same thickness as the first and second wirings and is formed at the same height as the formation positions of the first and second wirings.

3. The non-volatile memory device according to claim 2, wherein an end of the supporting film is connected to the guard ring layer.

4. The non-volatile memory device according to claim 2, wherein a through hole is provided at a predetermined position of the supporting film.

5. The non-volatile memory device according to claim 1, wherein a plurality of the memory layers are stacked in a height direction.

6. The non-volatile memory device according to claim 5, wherein the memory layers adjacent to each other in the height direction share the first wiring or the second wiring.

7. The non-volatile memory device according to claim 1, wherein the gas is an inert gas or an insulating gas.

8. The non-volatile memory device according to claim 1, wherein the variable resistance memory cell has a structure in which the rectifying element and the variable resistive element are stacked sequentially on the first wiring, and further comprising an insulating layer around the rectifying element.

9. The non-volatile memory device according to claim 1, further comprising a protective film covering a side surface of the variable resistance memory cell.

10. The non-volatile memory device according to claim 1, wherein the memory layer is formed above a control element, controlling the variable resistance memory cell, through an inter-layer insulating film, and
further comprising a contact which is provided around the variable resistance memory cell, two-dimensionally disposed at an intersection between the first and second wirings, in the guard ring layer, and connects the first and second wirings to the control element.

11. The non-volatile memory device according to claim 1, wherein the gas has a lower thermal conductivity than silicon oxide.

12. The non-volatile memory device according to claim 11, wherein the gas is Ar, $N_2$, or $SF_6$.

* * * * *